US007615763B2

(12) United States Patent
Vanderberg et al.

(10) Patent No.: US 7,615,763 B2
(45) Date of Patent: Nov. 10, 2009

(54) SYSTEM FOR MAGNETIC SCANNING AND CORRECTION OF AN ION BEAM

(75) Inventors: Bo H. Vanderberg, Gloucester, MA (US); Robert D. Rathmell, Murphy, TX (US); Edward C. Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 266 days.

(21) Appl. No.: 11/523,148

(22) Filed: Sep. 19, 2006

(65) Prior Publication Data

US 2008/0067436 A1 Mar. 20, 2008

(51) Int. Cl.
*H01J 37/317* (2006.01)
(52) U.S. Cl. .............................. 250/492.21; 250/492.1; 250/492.2; 250/492.3; 250/396 ML
(58) Field of Classification Search .............. 250/492.1, 250/492.2, 492.21, 492.22, 492.23, 492.3; 250/396 ML; 315/111.21, 111.41, 111.81; 118/723 CB, 723 FI
See application file for complete search history.

(56) References Cited

U.S. PATENT DOCUMENTS

| | | | | |
|---|---|---|---|---|
| 5,481,116 A * | 1/1996 | Glavish et al. | ........ | 250/396 ML |
| 5,481,166 A | 1/1996 | Moreira | | |
| 6,414,329 B1 * | 7/2002 | Benveniste et al. | ..... | 250/492.21 |
| 6,759,665 B2 * | 7/2004 | Benveniste et al. | ..... | 250/492.21 |
| 6,770,888 B1 * | 8/2004 | Benveniste et al. | .... | 250/396 ML |
| 6,794,661 B2 * | 9/2004 | Tsukihara et al. | ...... | 250/492.21 |
| 6,835,930 B2 * | 12/2004 | Benveniste et al. | .......... | 250/298 |
| 6,879,109 B2 * | 4/2005 | Benveniste et al. | ..... | 315/111.21 |
| 6,903,350 B1 * | 6/2005 | Vanderberg et al. | .... | 250/492.21 |
| 7,019,314 B1 * | 3/2006 | Benveniste et al. | ..... | 250/492.21 |
| 2003/0183780 A1 * | 10/2003 | Sano et al. | ............. | 250/492.21 |
| 2003/0201402 A1 * | 10/2003 | Ye et al. | ................. | 250/492.21 |
| 2007/0075259 A1 * | 4/2007 | Fujita | .................. | 250/396 ML |
| 2008/0121822 A1 * | 5/2008 | Fujita | .................... | 250/492.21 |

OTHER PUBLICATIONS

International Search Report, Int'l Application No. PCT/US2007/019903, Int'l Filing Date Sep. 13, 2007, 3 pgs.

\* cited by examiner

*Primary Examiner*—David A Vanore
*Assistant Examiner*—Michael Maskell
(74) *Attorney, Agent, or Firm*—Eschweiller & Associates, LLC

(57) ABSTRACT

A magnetic scanner employs constant magnetic fields to mitigate zero field effects. The scanner includes an upper pole piece and a lower pole piece that generate an oscillatory time varying magnetic field across a path of an ion beam and deflect the ion beam in a scan direction. A set of entrance magnets are positioned about an entrance of the scanner and generate a constant entrance magnetic field across the path of the ion beam. A set of exit magnets are positioned about an exit of the scanner and generate a constant exit magnetic field across the path of the ion beam.

27 Claims, 6 Drawing Sheets

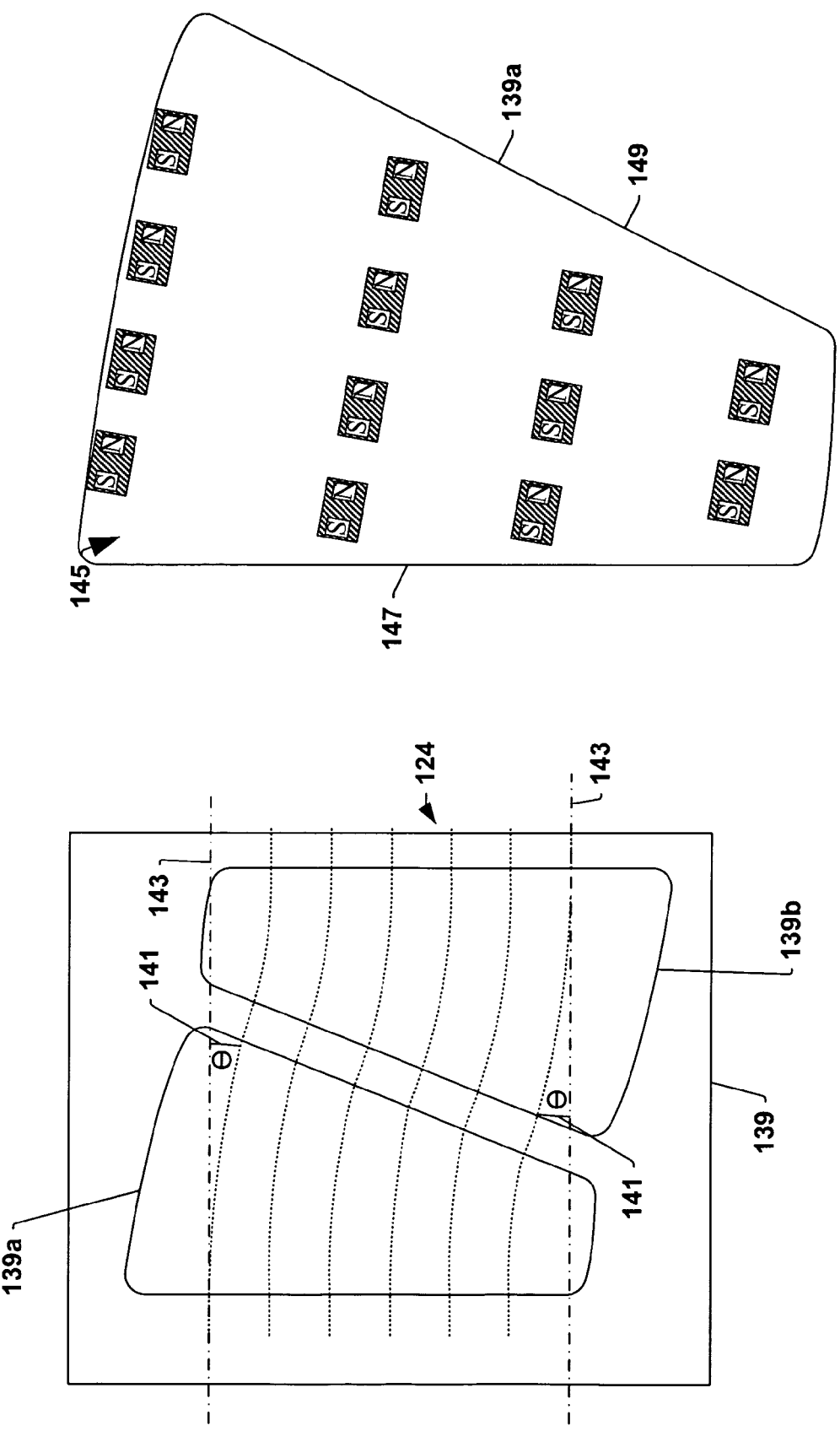

ID>A system for magnetic scanning and correction of an ion beam.

SYSTEM FOR MAGNETIC SCANNING AND CORRECTION OF AN ION BEAM

FIELD OF THE INVENTION

The present invention relates generally to ion implantation systems, and more specifically to systems and methods for scanning and correcting ion beams.

BACKGROUND OF THE INVENTION

In the manufacture of semiconductor devices, ion implantation is used to dope semiconductors with impurities or dopants. Ion implanters are used to treat silicon wafers with an ion beam, in order to produce n or p type extrinsic material doping or to form passivation layers during fabrication of an integrated circuit. When used for doping semiconductors, the ion implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion implanters include an ion source for generating positively charged ions from source materials. The generated ions are formed into a beam and directed along a predetermined beam path to an implantation station. The ion implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with gas molecules.

The mass of an ion relative to the charge thereon (e.g., charge-to-mass ratio) affects the degree to which it is accelerated both axially and transversely by a magnetic field. Therefore, the beam which reaches a desired area of a semiconductor wafer or other target can be made very pure since ions of undesirable molecular weight will be deflected to positions away from the wafer or beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For some ion implantation systems, the physical size of the beam is smaller than a target workpiece, so the beam is scanned in one or more directions in order to adequately cover a surface of the target workpiece. Generally, an electric or magnetic based scanner scans the ion beam in a fast scan direction and a mechanical device moves the target workpiece in a slow scan direction.

An electric scanner, in one example, comprises two electrodes to which time varying voltages are applied. The electric scanner creates a time varying electric field that diverts or alters the path of the ion beam, such that the ion beam after the scanner appears to originate from a vertex point. A parallelizer then redirects the ion beam along a path parallel to its original path.

One drawback to an electric scanner is that it can cause space-charge blowup and thereby limit the amount of beam current that can be delivered to a target workpiece. Beam blow-up is the increase of transverse velocity of a beam with distance along the beam path or axis, and space-charge blowup is beam blow up caused by beam-internal space-charge forces, which are proportional to a beam perveance. During ion beam drift in electric field free regions the ion beam attracts electrons generated from ionizing collisions with background gas or from secondary electron emission from collisions with aperture, for example, a process referred to as self-neutralization. Nonzero fields of the electric scanner remove the electrons from self-neutralization and cause the beam within the scanner to blow up, which can result in a beam envelope unmanageably large and thus beam current loss.

A magnetic scanner generates a time varying magnetic field through which the ion beam passes. The time varying magnetic field diverts or alters the path of the ion beam such that after the scanner the ion beam appears to originate from a vertex point. A parallelizer is then employed to bend the beam to a direction parallel to the ion beam prior to scanning.

The magnetic scanner does not suffer from the space-charge blow-up resulting from electric fields like the electric scanner. As a result, using a magnetic scanner instead of an electric scanner can permit higher beam currents to be obtained. However, it has been noted that the ion beam goes through an anomalous transport phase when the magnetic field in the scanning magnet has zero or close to zero amplitude. This effect is referred to as a zero-field effect (ZFE), caused by a multitude of simultaneous effects including cyclotron/betatron effects on self-neutralizing electrons as well as enhanced ion beam neutralization by free electron motion.

One technique to account for the anomalous transport phase is to immerse the magnetic scanner into a secondary magnetic field to prevent electron motion, such as described in Glavish et al., U.S. Pat. No. 5,481,116, filed Jun. 10, 1994. The presence of the second magnetic field prevents the anomalous transport phase by always having a non-zero magnetic field applied to the ion beam. However, this technique adds complexity to the scanner assembly in terms of adding a secondary magnetic circuit. Additionally, it immerses the complete scanner volume in a minimum field whose effects on beam transport, i.e. steering and focusing of an additional magnetic field, have to be taken into account, which increases the complexity of the beamline design. Furthermore, the presence of the second magnetic field suppressed self-neutralization and can reduce or limit beam current transmitted through the scanner.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention facilitate ion implantation by mitigating zero field effects which typically occur in magnetic based scanners during time periods of zero or about zero magnetic field amplitudes. A constant magnetic field is applied to an ion beam about an entrance and/or exit of the magnetic scanner in order to mitigate the zero field effect and smooth the flux profile.

In accordance with one aspect of the invention, a magnetic scanner employs constant magnetic fields to mitigate zero field effects. The scanner includes an upper pole piece and a lower pole piece that generate an oscillatory time varying magnetic field across a path of an ion beam and deflect the ion beam in a scan direction. A set of entrance magnets are positioned about an entrance of the scanner and generate a constant entrance magnetic field across the path of the ion beam, wherein the constant entrance magnetic field can have a varied orientation from the oscillatory time varying magnetic field. A set of exit magnets are positioned about an exit of the scanner and generate a constant exit magnetic field across the path of the ion beam. The constant exit magnetic field can have a varied orientation from the oscillatory time varying magnetic field. Other scanners, systems, and methods are disclosed.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 2 is a cross sectional view of a parallelizer in accordance with an aspect of the present invention.

FIG. 3 is a cross sectional view of a dipole magnet that can be employed in a parallelizer in accordance with an aspect of the present invention.

DETAILED DESCRIPTION OF THE INVENTION

Figure 1:
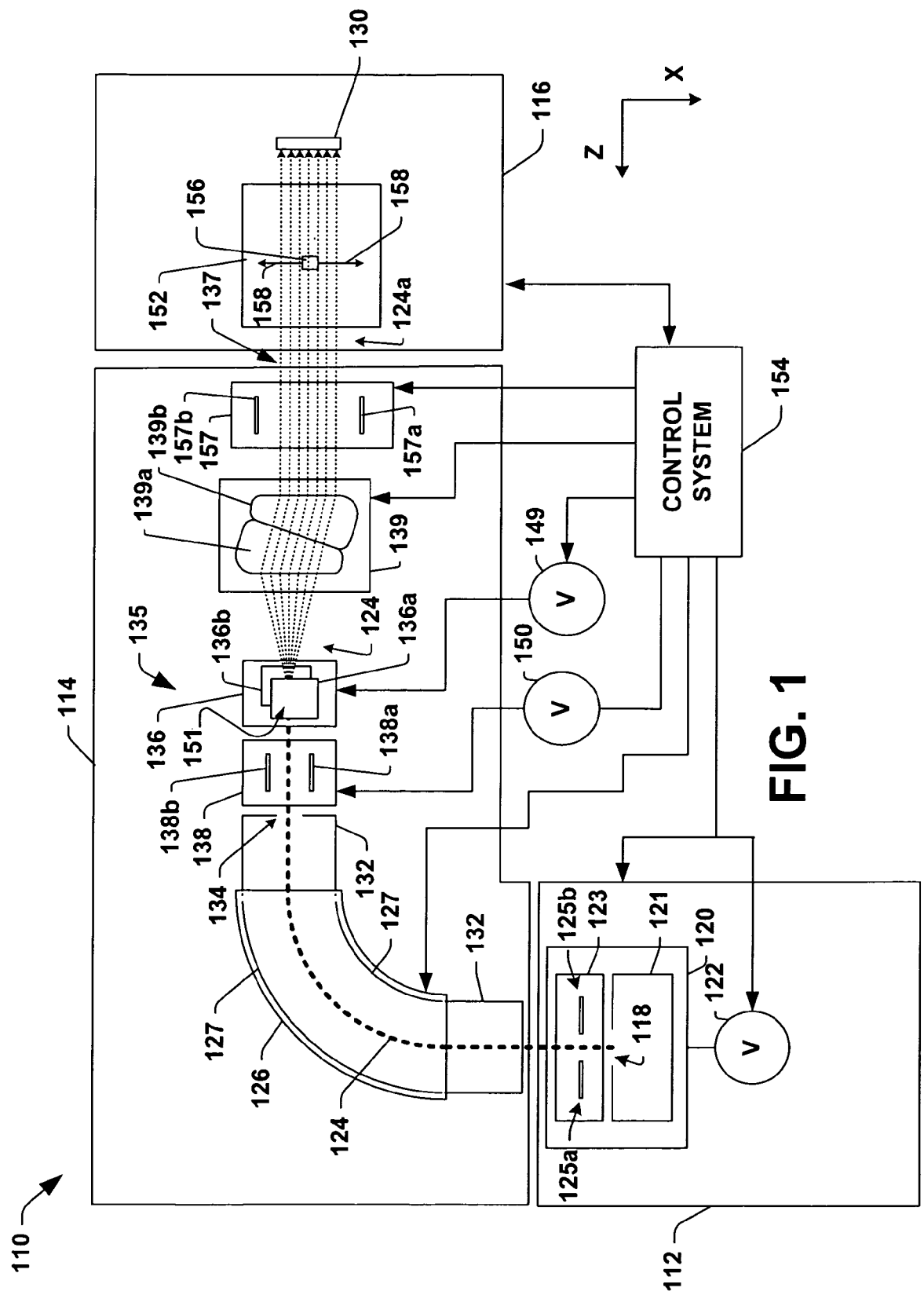
FIG. 1 illustrates an example ion implantation system in accordance with an aspect of the present invention.

The present invention will now be described with reference to the drawings wherein like reference numerals are used to refer to like elements throughout, and wherein the illustrated structures are not necessarily drawn to scale.

Aspects of the present invention facilitate ion implantation by mitigating the zero field effect, which typically occurs in magnetic based scanners during time periods of zero or about zero magnetic field amplitudes. A constant magnetic field is applied to an ion beam near or within the magnetic scanner in order to mitigate the zero field effect and smooth the flux profile.

FIG. 1 illustrates an example ion implantation system 110 in accordance with an aspect of the present invention. The system 110 is presented for illustrative purposes and it is appreciated that aspects of the invention are not limited to the described ion implantation system and that other suitable ion implantation systems can also be employed.

The system 110 has a terminal 112, a beamline assembly 114, and an end station 116. The terminal 112 includes an ion source 120 powered by a high voltage power supply 122 that produces and directs an ion beam 124 to the beamline assembly 114. The ion source 120 generates ions that are extracted and formed into the ion beam 124, which is directed along a beam path in the beamline assembly 114 to the end station 116.

To generate the ions, a gas of a dopant material (not shown) to be ionized is located within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated although the disclosure herein is applicable to systems wherein negative ions are generated as well.

The ions are controllably extracted through a slit 118 in the chamber 121 by an ion extraction assembly 123, in this example. The ion extraction assembly 123 comprises a plurality of extraction and/or suppression electrodes 125. The extraction assembly 123 can include, for example, a separate extraction power supply (not shown) to bias the extraction and/or suppression electrodes 125 to accelerate the ions from the generation chamber 121. It can be appreciated that since the ion beam 124 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles. Accordingly, the extraction assembly 123 is generally configured so that the beam is extracted at a high energy so that the beam does not blow up. Moreover, the beam 124, in this example, is generally transferred at a relatively high energy throughout the system and is reduced just before the workpiece 130 to promote beam containment.

The beamline assembly 114 has a beamguide 132, a mass analyzer 126, a scanning system 135, and a parallelizer 139. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the beam guide 132. In this manner, the mass analyzer 126 merely allows those ions in the beam 124 which have the desired charge-to-mass ratio to pass there-through and exit through a resolving aperture 134. It will be appreciated that ion beam collisions with other particles in the system 110 can degrade beam integrity. Accordingly, one or more pumps (not shown) may be included to evacuate, at least, the beamguide 132 and mass analyzer 126.

The scanning system 135 in the illustrated example includes a magnetic scanning element 136 and a magnetic or electrostatic focusing and/or steering element 138. Respective power supplies 149, 150 are operatively coupled to the scanning element 136 and the focusing and steering element 138, and more particularly to respective pieces 136a, 136b and electrodes 138a, 138b located therein. The focusing and steering element 138 receives the mass analyzed ion beam 124 having a relatively narrow profile (e.g., a "pencil" beam in the illustrated system 110). A voltage applied by the power supply 150 to the plates 138a and 138b operates to focus and steer the beam to the scan vertex 151 of the scanning element 136. A voltage waveform applied by the power supply 149 to coils surrounding the pole pieces 136a and 136b then scans the beam 124 back and forth, in this example. It will be appreciated that the scan vertex 151 can be defined as the point in the optical path from which each beamlet or scanned part of the ribbon beam appears to originate after having been scanned by the scanning element 136.

Magnetic based scanning of ion beams can result in the zero field effect, an anomalous transport phase when the magnetic field in the scanning magnet has zero or close to zero amplitude. There are at least two effects occurring close to zero magnetic field: below a field value necessary to confine free beam electrons, electrons from the outside of the scanner can flow freely into the scanner volume and promote neutralization of the ion beam. An increasing magnetic field will also energize these electrons thru a cyclotron resonance mechanism such that electrons gain energy and are swept out of the scanner volume. The combined effects or zero field effect can result in an irregular flux profile wherein the current density is temporarily increased or decreased when the magnetic field of the scanning magnet has a zero or close to zero amplitude.

Figure 4A:
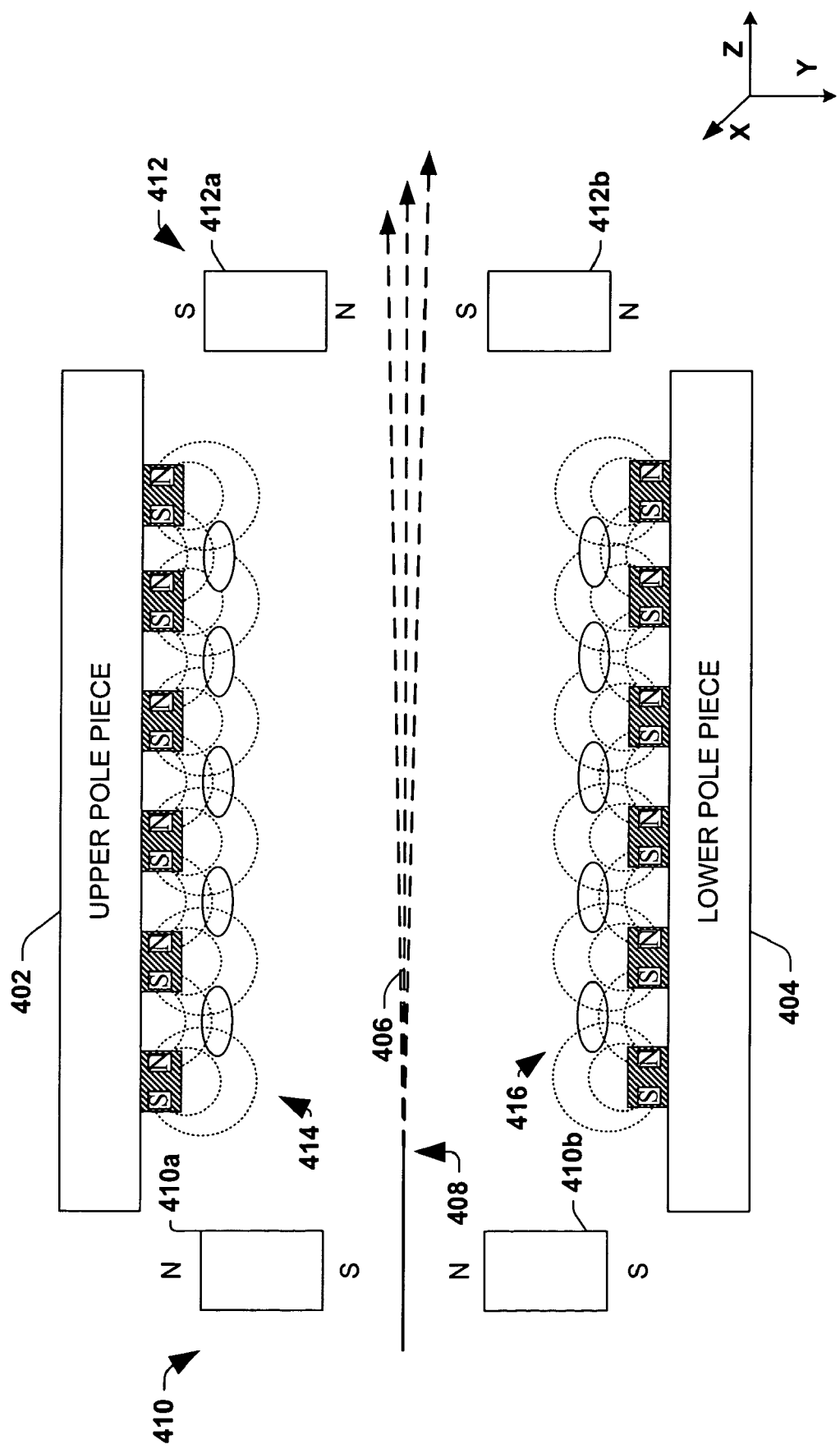
FIG. 4a is a cross sectional view of a magnetic scanner employing permanent magnets in accordance with an aspect of the present invention.
Figure 4B:
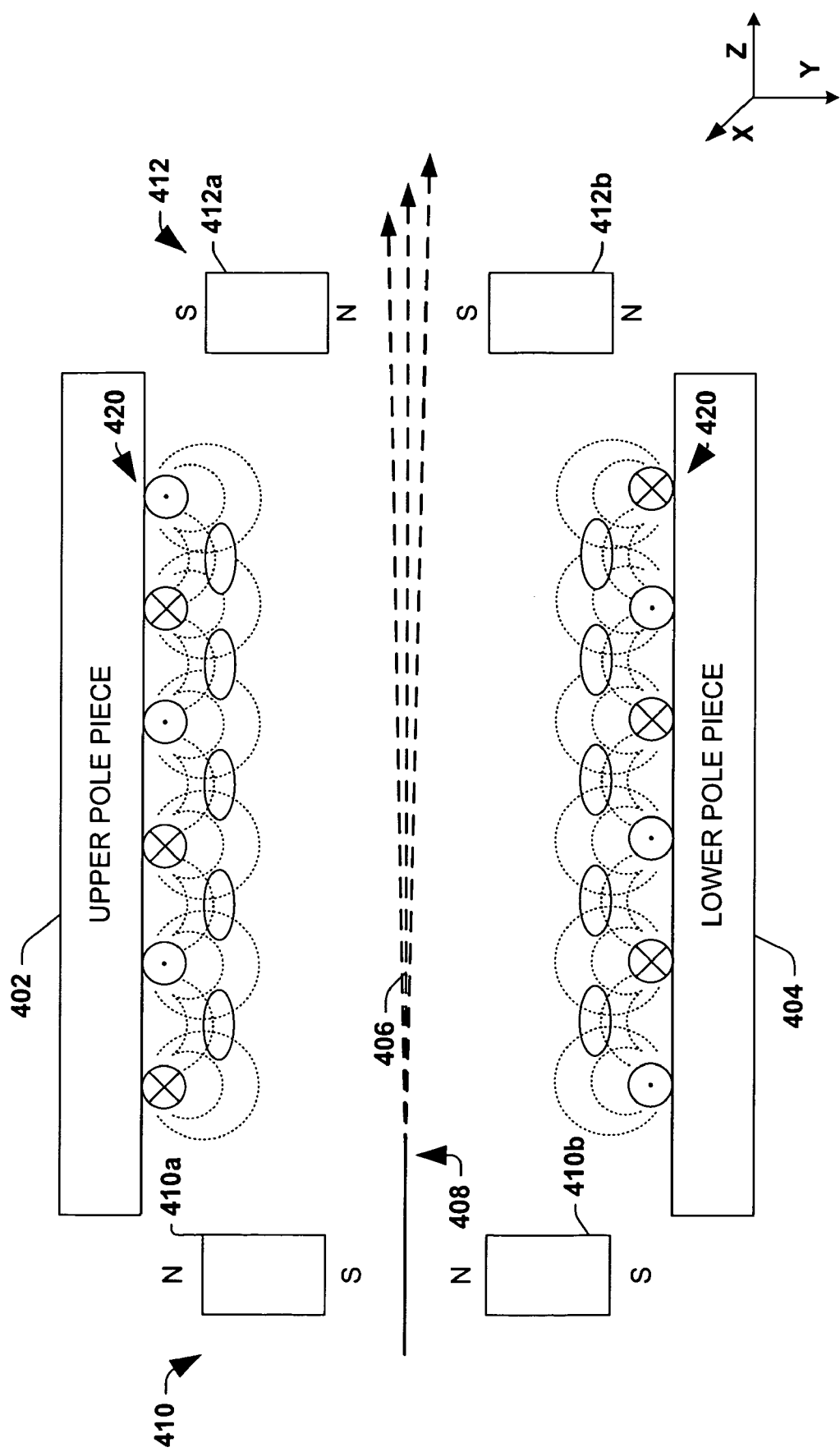
FIG. 4b is a cross sectional view of a magnetic scanner employing electromagnets in accordance with an aspect of the present invention.

However, the present invention provides enhanced confinement by employing supplemental or additional magnets (not shown) about the scanning element 136. In one example, a first set of permanent magnets is employed at an entrance of the scanning element 136 and a second set of permanent magnets is employed at an exit of the scanning element. In another example, smaller cusp magnets (not shown) are additionally employed on interior surfaces of the scanning element 136. The cusp magnets (not shown) can redirect escaping electrons back into the beam 124. FIGS. 4a and 4b, described infra, can be referenced for additional details.

The scanned beam 124 is then passed through the parallelizer/corrector 139, which comprises two dipole magnets 139a, 139b in the illustrated example. The dipoles are substantially trapezoidal and are oriented to mirror one another to cause the beam 124 to bend into a substantially s shape. Stated another way, the dipoles have equal angles and radii and opposite directions of curvature.

The parallelizer 139 causes the scanned beam 124 to alter its path such that the beam 124 travels parallel to a beam axis regardless of the scan angle. As a result, the implantation angle is relatively uniform across the workpiece 130.

One or more deceleration stages 157 are located downstream of the parallelization component 139 in this example. Up to this point in the system 110, the beam 124 is generally transported at a relatively high energy level to mitigate the propensity for beam blow up, which can be particularly high where beam density is elevated such as at the resolving aperture 134, for example. The deceleration stage 157 comprises one or more electrodes 157a, 157b operable to decelerate the beam 124. The electrodes 157 are typically apertures thru which the beam travels and may be drawn as straight lines in FIG. 1.

Nevertheless, it will be appreciated that while two electrodes, 125a and 125b, 138a and 138b and 157a and 157b, are respectively illustrated in the exemplary ion extraction assembly 123, focusing and steering element 138 and deceleration stage 157, that these elements 123, 138 and 157 may comprise any suitable number of electrodes arranged and biased to accelerate and/or decelerate ions, as well as to focus, bend, deflect, converge, diverge, scan, parallelize and/or decontaminate the ion beam 124 such as provided in U.S. Pat. No. 6,777,696 to Rathmell et al. the entirety of which is hereby incorporated herein by reference. Additionally, the focusing and steering element 138 may comprise electrostatic deflection plates (e.g., one or more pairs thereof), as well as an Einzel lens, quadrupoles and/or other focusing elements to focus the ion beam.

The end station 116 then receives the ion beam 124 which is directed toward a workpiece 130. It is appreciated that different types of end stations 116 may be employed in the implanter 110. For example, a "batch" type end station can simultaneously support multiple workpieces 130 on a rotating support structure, wherein the workpieces 130 are rotated through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. In hybrid systems the workpiece 130 may be mechanically translated in a first (Y or slow scan) direction while the beam is scanned in a second (X or fast scan) direction to impart the beam 124 over the entire workpiece 130.

The end station 116 in the illustrated example is a "serial" type end station that supports the single workpiece 130 along the beam path for implantation. A dosimetry system 152 is included in the end station 116 near the workpiece location for calibration measurements prior to implantation operations. During calibration, the beam 124 passes through dosimetry system 152. The dosimetry system 152 includes one or more profilers 156 that may continuously traverse a profiler path 158, thereby measuring the profile of the scanned beams.

The profiler 156, in this example, may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution.

A control system 154 is present that can control, communicate with and/or adjust the ion source 120, the mass analyzer 127, the magnetic scanner 136, the parallelizer 139, and the dosimetry system 152. The control system 154 may comprise a computer, microprocessor, etc., and may be operable to take measurement values of beam characteristics and adjust parameters accordingly. The control system 154 can be coupled to the terminal 112 from which the beam of ions is generated, as well as the mass analyzer 126 of the beamline assembly 114, the scanning element 136 (e.g., via power supply 149), the focusing and steering element 138 (e.g., via power supply 150), the parallelizer 139 and the deceleration stage 157. Accordingly, any of these elements can be adjusted by the control system 154 to facilitate desired ion beam properties. For example, the energy level of the beam can be adapted to adjust junction depths by adjusting the bias applied to electrodes in the ion extraction assembly 123 and the deceleration stage 157, for example. The strength and orientation of magnetic field generated in the mass analyzer 126 can be adjusted, such as by regulating the amount of electrical current running through field windings therein to alter the curvature of the path of the desired ion beam, for example. The angle of implantation can be further controlled by adjusting the voltage applied to the steering element 138, for example.

FIG. 2 is a cross sectional view of a parallelizer 139 in accordance with an aspect of the present invention. The view is provided for illustrative purposes and aspects of the invention are not limited to the parallelizer shown and described.

The parallelizer 139 includes first and second dipoles 139a, 139b. The dipoles 139a, 139b cause the scanned beam to bend through an angle ⊖ 141 relative to a direction 143 parallel to the original trajectory or axis of the beam 124, thus giving the beam its substantially s shape. In one example, ⊖ 141 is about 30 degrees. In any event, because the two dipoles 139a, 139b mirror one another, the respective beamlets 124a are of a substantially equal path length 137 (FIG. 1) which promotes the uniformity of the scanned ribbon beam exiting the parallelizer. In one embodiment, each of the beamlets 124a traversing the parallelizer experiences the same focusing at the entrance and exits of the dipole of the parallelizer, and, since the path length for each beamlet is equal, beam size or angle changes after the parallelizer are the same independent of scan angle. If the beamlets experience beam blowup due to space-charge forces, prominent especially at low energies, each beamlet will again have identical size at the exit of the parallelizer since space-charge forces will have acted on the beam for an equal distance. It will be understood that it is advantageous if the length 137 of the beamlets 124a is kept relatively short by using small bend angles in the dipoles 139a, 139b. This is advantageous at least because it minimizes the drift length during which beams can experience beam blow-up and keeps an overall footprint of the implantation system 100 compact.

FIG. 3 is a cross sectional view of a dipole magnet that can be employed in a parallelizer in accordance with an aspect of the present invention. Cusp magnets 145, in this example, are located on top and bottom pole pieces of the dipole magnet. FIG. 3 depicts a possible arrangement on the bottom or top. The cusp magnets 145 to help contain and/or otherwise control the ion beam 124 passing there through via confinement of electrons (even though only one dipole 139a is illustrated in FIG. 7). The cusp magnets 145 operate as described in U.S. Pat. No. 6,414,329 to Benveniste et al. the entirety of which is hereby incorporated herein by reference. More particularly, the bipolar magnets 145 are oriented so that individual magnetic fields generated thereby are additive with one another and extend in toward the beam (not shown). Many suitable orientations (and/or sizing and/or spacings and/or numbers) of the cusp magnets 145 are possible and are contemplated as falling with the scope of the disclosure herein (e.g., to attain desired beam containment and/or control goals). It can be advantageous to design the cusp fields such that they are strong at the wall of the beamguide to confine electrons efficiently but fall off rapidly in amplitude from the wall so that ion beam transport is not affected.

Additionally, where RF or microwave energy is provided in the dipoles 139, the cooperative interaction between the magnetic and electric fields results in the creation of an electron cyclotron resonance (ECR) condition 155 between the magnets 145. Such an ECR condition advantageously provides enhancement of a beam plasma associated with the ion beam (not shown) traveling through the dipoles 139, whereby beam integrity is improved. The creation of an ECR condition around the ion beam mitigates beam blow up by energizing plasma electrons to produce more plasma thru ionizing collisions, thereby enhancing the plasma density and promoting external neutralization of the space-charge of the ion beam.

An electron cyclotron resonance condition occurs when an alternating electric field is applied to a charged particle in a static magnetic field, such that the frequency of the electric field matches the natural frequency of rotation of the charged particle around the static magnetic field lines. Where this resonance condition is attained (e.g., in regions 155), a single frequency electromagnetic wave can accelerate a charged particle very efficiently.

FIG. 4a shows a cross sectional view of a magnetic scanner 400 employing permanent magnets in accordance with an aspect of the present invention. The permanent magnets are positioned at an entrance and exit of the scanner 400 so as to mitigate flux variations due to the zero field effect.

The scanner 400 includes an upper pole piece 402 and a lower pole piece 404 that generate an oscillatory time varying magnetic field that deflects an ion beam 406 in a scan (x) direction out of page from a vertex 408. As a result, the ion beam 406 oscillates in the scan direction. The pole pieces 402, 404 are electronically activated and include coils (not shown) through which electrical current can flow. A power supply or other controllable power delivery device (not shown) is coupled to the coils to control the oscillation of the magnetic field and the diverting or fanning of the ion beam 406 in the scan direction.

Additionally, the scanner 400 includes a set of entrance magnets 410 and exit magnets 412 for mitigating beam flux variations. The entrance magnets 410 and the exit magnets 412 are comprised of one or more permanent magnets that maintain a constant magnetic field across the ion beam 406. The entrance and exit magnets 410 and 412 are arranged with opposite polarity, such that the effect on the ion beam 406 is relatively small and constant.

In this example, the entrance magnets 410 are a pair of permanent magnets 410a and 410b oriented with their south poles and their north poles as shown. Likewise, the exit magnets 412 in this example are a pair of permanent magnets 412a and 412b oriented with their south poles and their north poles as shown and positioned at an exit of the scanner 400. The entrance and exit magnets 410, 412 can be positioned within the scanner 400 or external to the scanner 400. The external arrangement serves as a barrier for electrons to enter or exit the volume of the scanner 400 so that they cannot be swept out of the scanner volume by e.g., a cyclotron effect or enter as the magnetic field goes to zero. In alternate aspects of the invention, electromagnets can be employed as entrance and exit magnets instead of or in addition to the permanent magnets.

The arrangement of the magnets 410, 412 induces a magnetic field perpendicular to the direction of propagation of the ion beam. The magnetic field amplitude of the magnets 410, 412 is relatively high in proximity to the magnets 410, 412 but weak otherwise. An example of a suitable material that yields the relatively high magnetic field amplitude is a compound of cobalt-samarium, however other suitable materials can be employed. With such an arrangement, the weak fields can suppress the migration of electrons across the field, wherein the impact on the ion beam 406 traveling about midway between the upper and lower pole pieces 402, 404 is mitigated. Additionally, the external arrangement shown in FIG. 4a mitigates demagnetization by the oscillatory magnetic field generated by the pole pieces 402, 404.

As stated above, electromagnets can also be employed in place of the permanent magnets for the entrance magnets 410 and the exit magnets 412. Such electromagnets are placed at the entrance and exit of the scanner 400 and arranged to generate magnetic fields perpendicular to the direction of propagation of the ion beam.

The scanner 400 also includes cusp magnets 414, 416, in this example, that can facilitate mitigation of flux variations. Additional cusp magnets can also be present on side surfaces, top and bottom surfaces, and entrance and exit surfaces of the scanner 400, although not all of these variations are depicted in FIGS. 4a and 4b.

The cusp magnets mitigate the loss of electrons within the scanner, where electrons are free to move along magnetic field lines, but can reach the pole pieces unless they are suitably confined. During zero field transitions, electrons of the ion beam 406 are confined by the entrance and exit fields generated by the entrance and exit magnets 410, 412, respectively and by cusp confinement on at least some or all of the inner surfaces of the scanner volume through which the ion beam 406 travels. In one example, the cusp magnets and/or the entrance and exit magnets 410, 412 are comprised of low electrical conductivity material, such as ceramic magnets, in order to mitigate eddy current losses.

FIG. 4B is a cross sectional view of a magnetic scanner employing electromagnets to generate cusp fields in accordance with an aspect of the present invention. The scanner 400 is substantially similar to that of the scanner 400 of FIG. 4A. However, in this example, electromagnets are arranged to generate a cusp field via the current flowing through the wires 420 of the electromagnets instead of employing the cusp magnets 414, 416 of FIG. 4A. The electromagnets are configured such that the flux linkage from the scanning magnetic field thru the electromagnet windings is negligible, e.g., by connecting electromagnets in series such that their individual flux linkages from the scanning field cancel out.

The arrangements of the scanners shown and described above with respect to FIGS. 4A and 4B are provided as an example in accordance with an aspect of the invention. It is appreciated that variations of the arrangement are contemplated and in accordance with other aspects of the invention.

Figure 5:
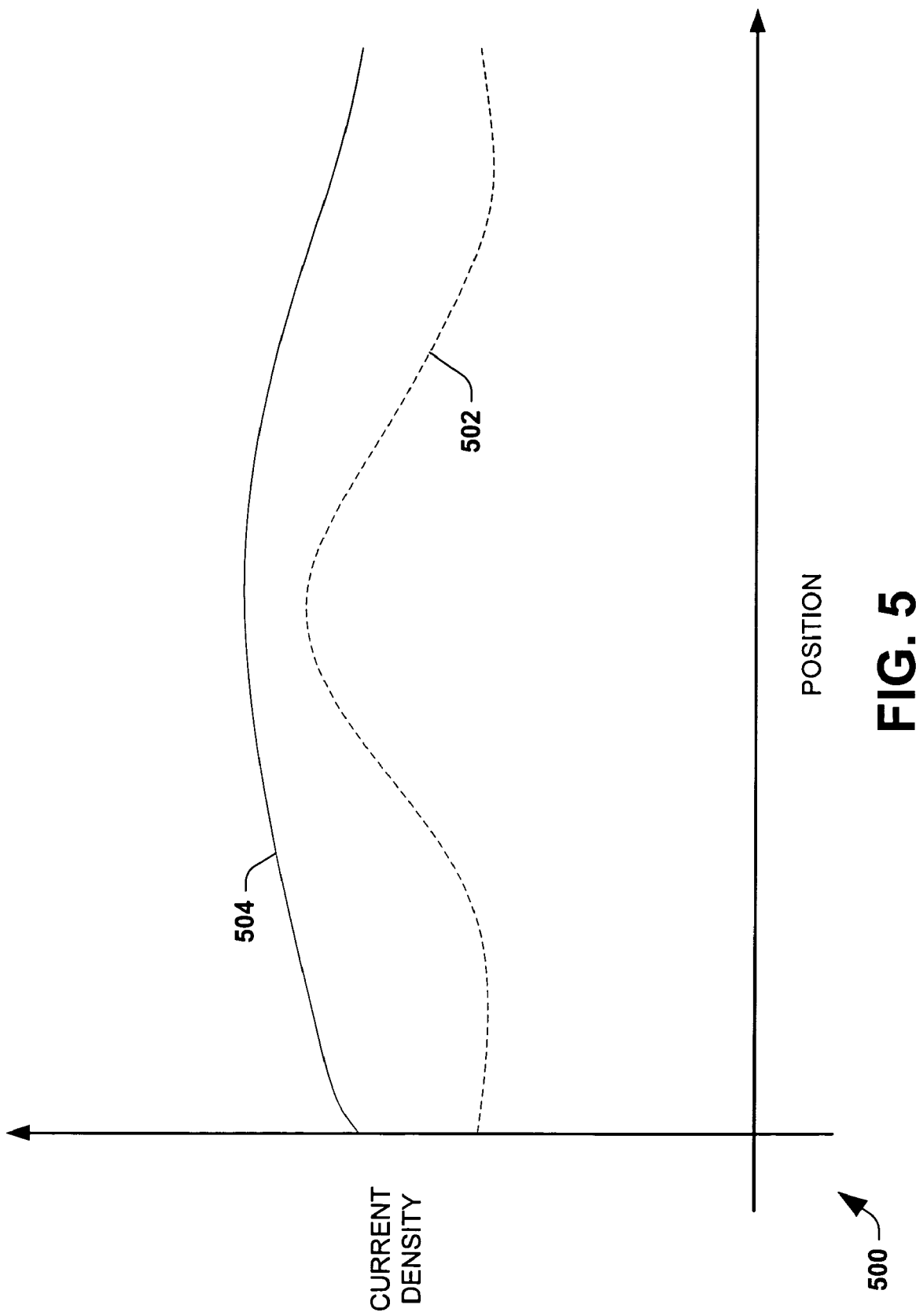
FIG. 5 is a graph illustrating smoothing of a flux profile by employing an example scanner in accordance with the present invention.

FIG. 5 is a graph 500 illustrating smoothing of a flux profile by employing an example scanner in accordance with the present invention. The graph 500 illustrates a comparison in flux profile for a conventional magnetic scanner and a scanner in accordance with the present invention. The graph 500 is illustrative in nature and is not intended to depict actual or experimental values.

An x-axis depicts wafer position from left to right across a target wafer. A y-axis depicts current density for an ion beam at the target wafer. The graph 500 assumes an ion implantation system that generates an ion beam and employs a magnetic scan to sweep the ion beam across the target wafer. A line 502 depicts a profile for a conventional magnetic scanner. Here, a varied flux profile is shown that results from the zero field effect. It can be seen that near or proximate to a portion of the target wafer that corresponds to a zero or near zero magnetic field, the current density greatly increases. As a result, this portion of the target wafer can have a higher than desired or selected dopant concentration. Additionally, other portions of the line 502 indicate that elsewhere, the current density is lowered and may, for example, require longer implant times. It should be noted that the zero field effect mentioned earlier typically occurs during a relatively short period of time compared to the scan period, whereas the spatial flux distribution from a scanned beam can be viewed as a superposition of individual pencil beams each with a certain width. Typically in high current implanters the width of the pencil beam is a fraction of the total scan width much larger than the ratio of zero-field effect time to scan period, such that the flux distribution is a spatially smoothed distribution of what would be a distribution with sharp increases or decreases in flux if the pencil beam size were very small.

A line 504 depicts a flux profile for a magnetic scanner in accordance with an aspect of the present invention. The magnetic scanner employs permanent magnets at entrance and exit areas of the scanner in order to mitigate the zero field effect. FIG. 4 depicts an example of a suitable magnetic scanner in accordance with the present invention. It can be seen that the flux profile is smoother than that of the conventional scanner as shown by comparing the line 504 to the line 502 which have been assumed to have the same pencil beam width entering the scanner. Additionally, a higher current density is obtained for the line 504, a result of the better electron confinement inside the scanner promoting enhanced beam transport throughout the scanner, similar to the beneficial effect of cusp confinement in static dipole fields. An example of suitable use of cusp fields is described in U.S. Pat. No. 6,414,329 to Benveniste et al. the entirety of which is hereby incorporated herein by reference.

Figure 6:
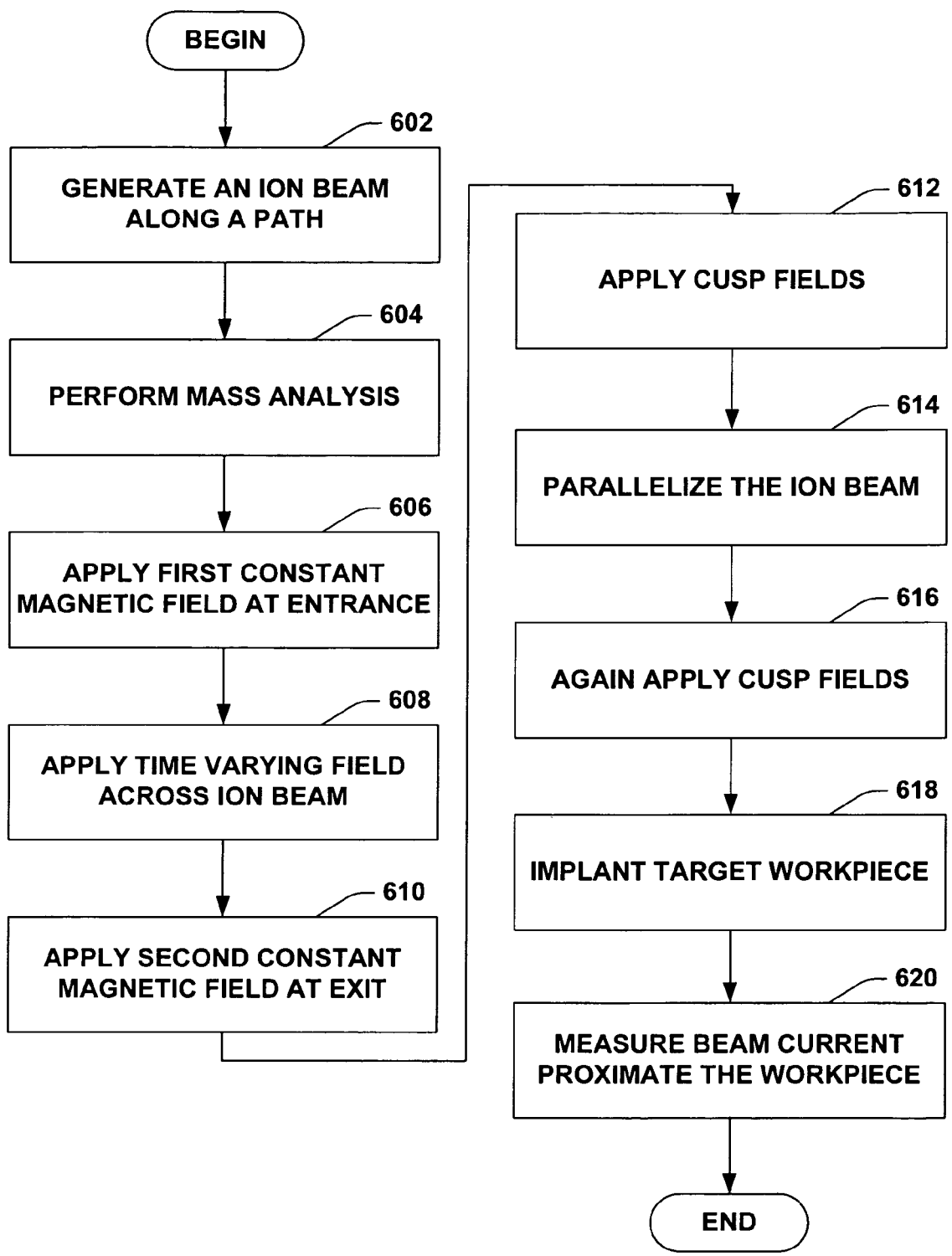
FIG. 6 is a flow diagram illustrating a method of mitigating the zero field effect for a magnetic scanner in accordance with an aspect of the present invention.

FIG. 6 is a flow diagram illustrating a method 600 of mitigating zero field effects for a magnetic scanner in accordance with an aspect of the present invention. The method 600 employs a permanent magnetic field applied across an ion beam in order to mitigate zero field effects.

The method 600 begins at block 602, wherein an ion beam is generated. An ion source is employed to initially form the ion beam from source materials. The ion beam contains one or more selected dopants or ions, which are typically, but not necessarily, positively charged.

Mass analysis is performed on the ion beam at block 604. A magnetic field is established across a path of the ion beam according to a selected charge-to-mass ratio. As a result, selected dopants or ions travel along a desired path and pass through whereas other ions, particles, and contaminants, do not and are, as a result, removed from the ion beam.

A first permanent or constant magnetic field is applied to the ion beam at an entrance of a magnetic scanner at block 606. The first magnetic field is relatively high in amplitude relatively close to magnets employed but relatively weak farther away. In one example, the first magnetic field is generated by a pair of permanent magnets positioned at the entrance of the magnetic scanner.

A time varying oscillatory magnetic field is then applied to the ion beam within the magnetic scanner to divert or fan the ion beam at a desired angles at block 608. The time varying magnetic field can be obtained by supplying a time varying current to coils of upper and lower electromagnets.

A second permanent magnetic field is applied to the ion beam at an exit of the magnetic scanner at block 610. Generally, the second magnetic field is relatively high in amplitude relatively close to magnets employed but relatively weak farther away. In one example, the second magnetic field is generated by a pair of permanent magnets positioned at the exit of the magnetic scanner. Both permanent magnetic fields serve to mitigate the occurrence of a zero or about zero magnitude magnetic field across the ion beam by maintaining a non-zero magnetic field across the ion beam. The second field and the first field are offset in orientation from the time varying oscillatory magnetic field so as to mitigate their impact on scanning of the ion beam. The second field and the first field may have the same field orientation or can have varied field orientations.

Furthermore, scanner cusp fields can be generated at block 612 to mitigate migration of electrons from the scanner. The scanner cusp fields are typically located across one or more surfaces of the magnetic scanner. Some additional description of suitable cusp fields are described above.

The ion beam is then parallelized at block 614 by altering the diverted or fanned ion beam along an axis parallel to a common axis. Corrector cusp fields are also generated at block 616 to mitigate migration of electrons. Generally, the corrector cusp fields are positioned along one or more interior surfaces of a corrector or parallelizer.

The ion beam implants the one or more selected dopants or ions into a target workpiece at block 618. The first and/or second permanent magnetic fields yield a relatively smoother flux profile across the target workpiece by mitigating current variations and smoothing the flux profile and mitigating the zero field effect.

Ion beam current is measured proximate to the target workpiece at block 620. In one example, the beam current is measured with a large Faraday plate located at a fixed distance downstream of the scanner with a profiler cup traveling across the ion beam.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
   an ion source that generates an ion beam along a beam path;
   a mass analysis component downstream of the ion source that performs mass analysis on the ion beam;
   a magnetic scanner downstream of the mass analysis component that generates a time varying oscillatory magnetic field across a portion of the beam path;
   a constant magnetic field generator proximate to the magnetic scanner that generates a static magnetic field across the beam path to mitigate zero field effects, the constant magnetic field generator comprising:
      a set of entrance magnets proximate to an entrance of the magnetic scanner and having a first polarity arrangement; and
      a set of exit magnets proximate to an exit of the magnetic scanner and having a second polarity arrangement that is opposite the first polarity arrangement;
   a parallelizer downstream of the magnetic scanner that redirects the ion beam parallel to a common axis; and
   an end station positioned downstream of the parallelizer component that receives the ion beam;
   wherein the static magnetic field generated by the constant magnetic field generator varies in amplitude along the beam path from an entrance of the magnetic scanner to an exit of the magnetic scanner.

2. The system of claim 1, further comprising cusp field generators along at least a portion of interior surfaces of the magnetic scanner that generate magnetic cusp fields to facilitate electron confinement.

3. The system of claim 1, further comprising cusp field generators along at least a portion of interior surfaces of the parallelizer that generate magnetic cusp fields to facilitate electron confinement.

4. The system of claim 1, wherein the constant magnetic field generator comprises a pair of permanent magnets positioned about an entrance of the magnetic scanner.

5. The system of claim 4, wherein the constant magnetic field generator further comprises a second pair of permanent magnets positioned about an exit of the magnetic scanner.

6. The system of claim 1, wherein the constant magnetic field generator comprises a pair of permanent magnets positioned about an exit of the magnetic scanner.

7. The system of claim 1, wherein the constant magnetic field generator comprises a pair of permanent magnets positioned external to the magnetic scanner.

8. The system of claim 1, wherein the constant magnetic field generator comprises a pair of permanent magnets positioned internal to the magnetic scanner.

9. The system of claim 1, wherein the constant magnetic field generator comprises a pair of electromagnets positioned about the magnetic scanner.

10. The system of claim 1, wherein the constant magnetic field generator comprises a pair of permanent magnets comprised of Cobalt-Samarium compounds.

11. The system of claim 1, further comprising an accel/decel assembly downstream of the parallelizer.

12. A magnetic scanner comprising:
    an upper pole piece and a lower pole piece that generate an oscillatory time varying magnetic field across a path of an ion beam and deflect the ion beam in a scan direction;
    a set of entrance magnets positioned about an entrance of the scanner that generate a constant entrance magnetic field across the path of the ion beam; and
    a set of exit magnets positioned about an exit of the scanner that generate a constant exit magnetic field across the path of the ion beam, wherein the set of entrance magnets and the set of exit magnets comprise separate magnetic field sources;
    wherein the set of entrance magnets has a polarity arrangement that is opposite a polarity arrangement of the set of exit magnets.

13. The magnetic scanner of claim 12, wherein the set of entrance magnets and the set of exit magnets are comprised of permanent magnets.

14. The magnetic scanner of claim 12, wherein the set of entrance magnets comprise a pair of permanent magnets having south poles oriented toward the lower pole piece and north poles oriented toward the upper pole piece.

15. The magnetic scanner of claim 12, wherein the set of exit magnets comprise a pair of permanent having south poles oriented toward the lower pole piece and north poles oriented toward the upper pole piece.

16. The magnetic scanner of claim 12, wherein the oscillatory time varying magnetic field is perpendicular to interior faces of the upper pole piece and the lower pole piece.

17. The magnetic scanner of claim 12, wherein the upper pole piece and the lower pole piece comprise coils that receive a time varying current that induces the oscillatory time varying magnetic field.

18. The magnetic scanner of claim 17, further comprising a controllable power supply coupled to the coils of the upper pole piece and the lower pole piece.

19. The magnetic scanner of claim 12, further comprising cusp magnets positioned along an interior face of the upper pole piece and an interior face of the lower pole piece to facilitate electron confinement.

20. A method of operating an ion implantation system comprising:
: generating an ion beam along a beam path;
: performing mass analysis on the ion beam;
: applying a first constant magnetic field at an entrance of a magnetic scanner, the first magnetic field having a first polarity;
: applying a time varying oscillatory magnetic field to the ion beam within the magnetic scanner to scan the ion beam in a scan direction; and
: applying a second constant magnetic field at an exit of the magnetic scanner the second magnetic field having a second polarity that is opposite the first polarity;
: wherein the first and second constant magnetic fields are substantially parallel to the time varying oscillatory magnetic field.

21. The method of claim 20, wherein the first constant magnetic field and the second constant magnetic field are oriented to mitigate the zero field effect.

22. The method of claim 20, further comprising parallelizing the ion beam subsequent to applying the second constant magnetic field.

23. The method of claim 20, further comprising generating cusp fields about interior surfaces of the magnetic scanner to mitigate migration of electrons from the beam.

24. The method of claim 20, further comprising receiving the ion beam at an end station.

25. The method of claim 20, further comprising measuring beam current of the ion beam proximate to a target workpiece.

26. An ion implantation system comprising:
: an ion source that generates an ion beam along a beam path;
: a mass analysis component downstream of the ion source that performs mass analysis on the ion beam;
: a magnetic scanner downstream of the mass analysis component that generates a time varying oscillatory magnetic field across a portion of the beam path;
: a constant magnetic field generator that generates a static magnetic field across the beam path to mitigate zero field effects, the constant magnetic field generator comprising:
:: a set of entrance magnets proximate to an entrance of the magnetic scanner and having a first polarity arrangement; and
:: a set of exit magnets proximate to an exit of the magnetic scanner and having a second polarity arrangement that is opposite the first polarity arrangement;
: a parallelizer downstream of the magnetic scanner that redirects the ion beam parallel to a common axis; and
: an end station positioned downstream of the parallelizer component that receives the ion beam;
: wherein the static magnetic field generated by the constant magnetic field generator is substantially parallel to the time varying oscillatory magnetic field.

27. The ion implantation system of claim 10, wherein the parallelizer comprises two dipole magnets which are substantially trapezoidal and which are oriented to mirror one another.

* * * * *

UNITED STATES PATENT AND TRADEMARK OFFICE
CERTIFICATE OF CORRECTION

PATENT NO. : 7,615,763 B2
APPLICATION NO. : 11/523148
DATED : November 10, 2009
INVENTOR(S) : Bo H. Vanderberg et al.

It is certified that error appears in the above-identified patent and that said Letters Patent is hereby corrected as shown below:

Column 11, Claim 1, line 50 and 51; please remove the statement "proximate to the magnetic scanner"

Signed and Sealed this

Twelfth Day of January, 2010

David J. Kappos
*Director of the United States Patent and Trademark Office*